(12) United States Patent
Shin

(10) Patent No.: US 9,105,514 B2
(45) Date of Patent: Aug. 11, 2015

(54) THREE-DIMENSIONAL NON-VOLATILE MEMORY DEVICE, MEMORY SYSTEM INCLUDING THE SAME, AND METHOD OF MANUFACTURING THE SAME

(75) Inventor: Hack Seob Shin, Hwaseong-si (KR)

(73) Assignee: SK Hynix Inc., Gyeonggi-do (KR)

( * ) Notice: Subject to any disclaimer, the term of this patent is extended or adjusted under 35 U.S.C. 154(b) by 490 days.

(21) Appl. No.: 13/601,121

(22) Filed: Aug. 31, 2012

(65) Prior Publication Data

US 2013/0100722 A1 Apr. 25, 2013

(30) Foreign Application Priority Data

Oct. 24, 2011 (KR) ........................ 10-2011-0108916

(51) Int. Cl.
*G11C 5/02* (2006.01)
*H01L 27/115* (2006.01)
(52) U.S. Cl.
CPC .... *H01L 27/11582* (2013.01); *H01L 27/11573* (2013.01)

(58) Field of Classification Search
CPC ................... H01L 27/11582; H01L 27/11573; H01L 27/11551; H01L 27/11578; H01L 21/8221; H01L 27/2481; G11C 2213/71
USPC ............. 365/51; 257/E21.423, E29.309, 324; 438/591
See application file for complete search history.

(56) References Cited

U.S. PATENT DOCUMENTS

| | | | |
|---|---|---|---|
| 7,977,736 B2 * | 7/2011 | Kim et al. ...................... 257/329 |
| 2010/0197121 A1 * | 8/2010 | Kim et al. ...................... 438/486 |
| 2011/0018050 A1 * | 1/2011 | Fujiwara et al. ............... 257/324 |
| 2011/0140121 A1 * | 6/2011 | Lee et al. ......................... 257/76 |

* cited by examiner

*Primary Examiner* — Fernando Hidalgo
(74) *Attorney, Agent, or Firm* — William Park & Asssociates Ltd.

(57) ABSTRACT

A 3D non-volatile memory device including a substrate that includes a first region and a second region; a pipe channel film that is formed on the substrate in the first region; a pipe gate that substantially encloses the pipe channel film; and a driving gate that is formed on the substrate in the second region and has at least one dummy pattern.

20 Claims, 13 Drawing Sheets

THREE-DIMENSIONAL NON-VOLATILE MEMORY DEVICE, MEMORY SYSTEM INCLUDING THE SAME, AND METHOD OF MANUFACTURING THE SAME

CROSS-REFERENCE TO RELATED APPLICATION

This application claims priority to and the benefit of Korean Patent Application No. 10-2011-0108916, filed on Oct. 24, 2011, the disclosure of which is incorporated herein by reference in its entirety.

BACKGROUND

1. Field of Invention

The present invention generally relates to a non-volatile memory device. More specifically, the present invention relates to a three-dimensional (3D) non-volatile memory device, a memory system including the same, and a method of manufacturing the same.

2. Description of Related Art

A memory device with a three-dimensional (3D) structure in which memory cells are arranged in a 3D manner for the purpose of high-integration of memory devices has been suggested. Memory devices with a 3D structure may effectively utilize an area of a substrate, and improve the degree of integration compared to a case in which memory cells are arranged in a two-dimensional (2D) manner. In particular, attempts to apply, to the 3D structure, a regular memory cell arrangement of a NAND flash memory device which is profitable to high integration among non-volatile memory devices, have been actively made.

The 3D non-volatile memory device includes a first region in which a plurality of memory strings are arranged, and a second region in which driving transistors for controlling the plurality of memory strings are formed.

The memory string includes a plurality of memory cells that are stacked along a vertical channel film protruding over a substrate. The memory string may further include a pipe connection transistor that is formed below the plurality of memory cells, and connects the plurality of memory cells stacked along a pair of vertical channel films. The pipe connection transistor includes a pipe channel film that is connected to the pair or vertical channel films, and a pipe gate that encloses the pipe channel film. Driving gates of the driving transistors may be formed on the same layer as that of the pipe gate. The pipe gate may be formed in the first region, and the driving gates may be formed in the second region.

As described above, when the pipe gate formed in the first region and the driving gates formed in the second region are formed on the same layer, the pipe gate and the driving gates may be simultaneously patterned. However, when the pipe gate and the driving gates are simultaneously patterned, reliability of a manufacturing process may be reduced.

FIGS. 1A to 1C are cross-sectional views showing a manufacturing method of a pipe gate and a driving gate of a conventional 3D non-volatile memory device.

Referring to FIG. 1A, as described above, an insulating film 103 is formed on a semiconductor substrate 101 including a first region (R1) and a second region (R2). Next, a conductive film 105 is formed on the insulating film 103. The conductive film 105 is used for forming a pipe gate and driving gates.

Next, pipe trenches (PT) are formed in the conductive film 105 by etching the conductive film 105. The pipe trenches (PT) define a region where a pipe channel film is to be formed.

Subsequently, a sacrificial film 111 is formed on the entire structure including the pipe trenches (PT) so that the pipe trenches PT are completely filled with the sacrificial film 111. In this instance, the sacrificial film 111 may also be formed on the conductive film 105 in the second region (R2).

Referring to FIG. 1B, the sacrificial film 111 is patterned. Therefore, the sacrificial film 111 remains inside the pipe trenches (PT) of the first region (R1) as sacrificial patterns 111a. A residual substance 111b of the sacrificial film may remain on the conductive film 105 in the second region (R2) in which the pipe trenches (PT) are not formed.

Referring to FIG. 1C, an etching process for patterning the conductive film 105 is performed.

Therefore, a pipe gate (PG) in which the sacrificial patterns 111a are embedded is formed in the first region (R1), and the driving gates (DG) are formed in the second region (R2). The pipe gate (PG) may be a pattern which is separated in units of memory blocks, and the sacrificial patterns 111a are embedded inside the pipe gate (PG). A shape of the residual substance 111b of the sacrificial film which remains in the second region (R2) may be transferred to the driving gates (DG) while the pipe gate (PG) and the driving gates (DG) are patterned. In this case, a defect 105a in a part which connects the driving gates (DG) may occur.

SUMMARY OF THE INVENTION

The present invention is directed to a 3D non-volatile memory device that may improve reliability of a manufacturing process, a memory system including the same, and a manufacturing method of the same.

An embodiment provides a 3D non-volatile memory device including: a substrate that includes a first region and a second region; a pipe channel film that is formed on the substrate in the first region; a pipe gate that substantially encloses the pipe channel film; and a driving gate that is formed on the substrate in the second region and has at least one dummy pattern.

An embodiment provides a memory system including: the 3D non-volatile memory device; and a memory controller that controls the 3D non-volatile memory device.

An embodiment provides a manufacturing method of a 3D non-volatile memory device, including: simultaneously forming, on a substrate, a pipe gate that is disposed in a first region and encloses a sacrificial pattern, and a driving gate that has at least one dummy pattern in a second region; removing the sacrificial pattern; and forming a pipe channel film in a region where the sacrificial pattern is removed.

BRIEF DESCRIPTION OF THE DRAWINGS

The above and other features and advantages of the present invention will become more apparent to those of ordinary skill in the art by describing in detail various embodiments thereof with reference to the attached drawings in which.

DETAILED DESCRIPTION OF EMBODIMENTS

The present invention will be described more fully hereinafter with reference to the accompanying drawings, in which embodiments of the invention are shown. This invention may, however, be embodied in different forms and should not be construed as limited to the embodiments set forth herein.

Figure 1A:
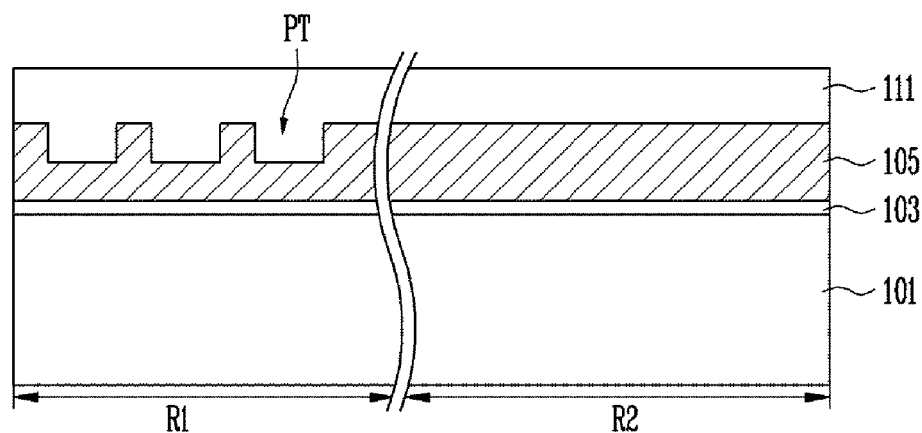
FIGS. 1A to 1C are cross-sectional views showing a manufacturing method of a pipe gate and a driving gate of a conventional 3D non-volatile memory device.
Figure 1B:
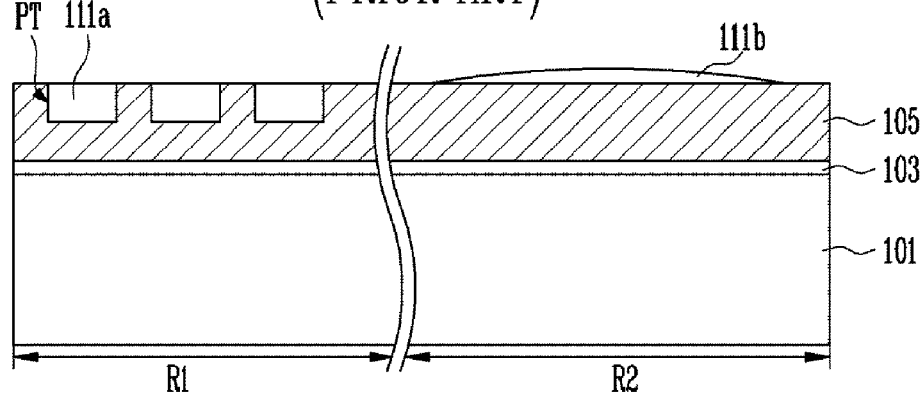
Figure 1C:
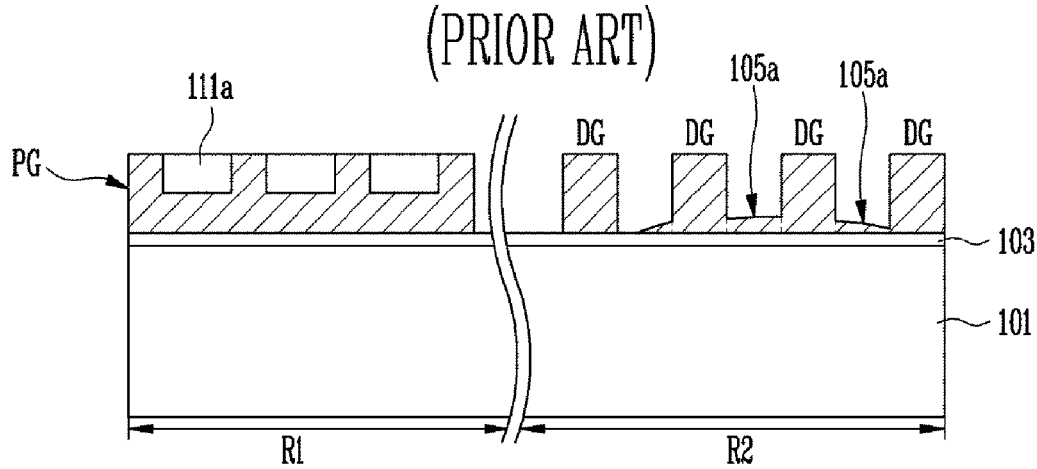
Figure 2A:
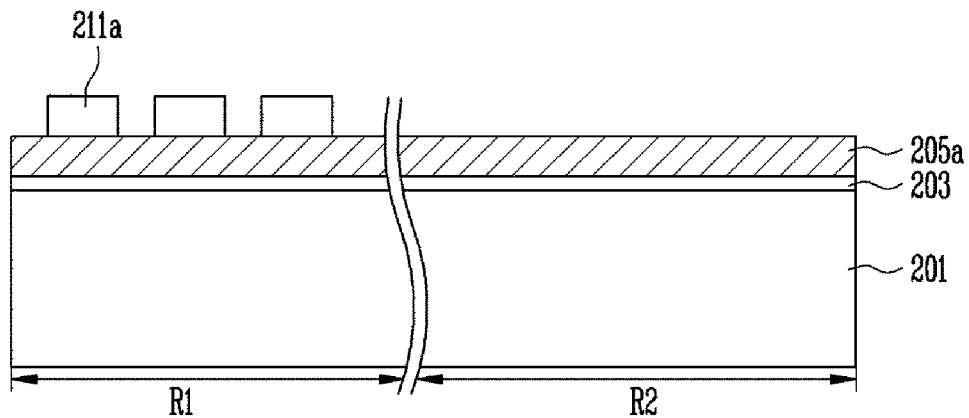
FIGS. 2A to 2C are cross-sectional views showing a manufacturing method of a pipe gate and a driving gate of a 3D non-volatile memory device according to an embodiment.
Figure 2B:
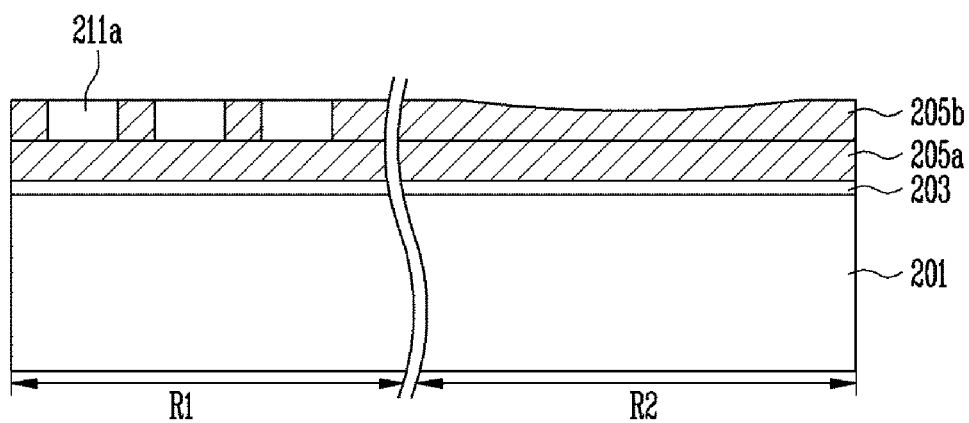
Figure 2C:
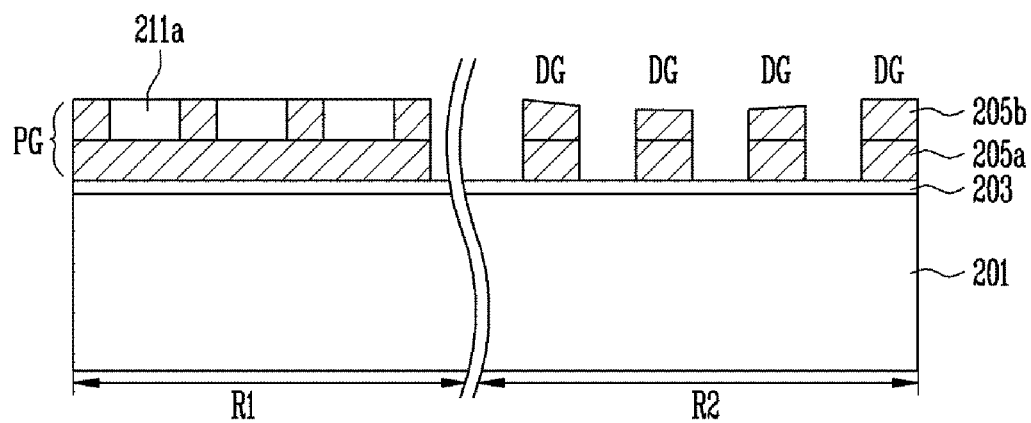

FIGS. 2A to 2C are cross-sectional views showing a manufacturing method of a pipe gate and a driving gate of a 3D non-volatile memory device according to an embodiment.

Referring to FIGS. 2A to 2C, the 3D non-volatile memory device includes a first region (R1) where a plurality of memory strings are to be disposed, and a second region (R2) where driving transistors for controlling the plurality of memory strings are formed.

On a semiconductor substrate 201 including the above-described first and second regions (R1) and (R2), an insulating film 203 and a first conductive film 205a are stacked. The first conductive film 205a may be used for forming a pipe gate and driving gates.

Next, sacrificial patterns 211a may be formed on the first conductive film 205a in the first region (R1). The sacrificial patterns 211a may be made of a material having an etch selectivity with respect to the first conductive film 205a and a second conductive film 205b, and may be made of, for example, a nitride film. The sacrificial patterns 211a may be patterns that define a region where a pipe channel film is to be formed.

Referring to FIG. 2B, the second conductive film 205b may be formed so that a space between the sacrificial patterns 211a is completely filled with the second conductive film 205b. The second conductive film 205b may be formed on the first conductive film 205a in the second region (R2). Subsequently, the second conductive film 205b may be patterned until the sacrificial patterns 211a are exposed. In this instance, since the sacrificial patterns 211a do not exist on the second region (R2) of the first conductive film 205a, a dishing phenomenon in which a surface of the second region (R2) of the second conductive film 205b is recessed may occur.

As described above, since the sacrificial patterns 211a are formed first, and then the second conductive film 205b is formed between the sacrificial patterns 211a, a phenomenon in which a residual substance of a sacrificial film remains on the second region (R2) may be prevented.

Referring to FIG. 2C, an etching process for patterning the first conductive film 205a and the second conductive film 205b may be performed. Therefore, a pipe gate (PG) that encloses the sacrificial patterns 211a may be formed in the first region (R1), and driving gates (DG) may be formed in the second region (R2). The pipe gate (PG) may be a pattern that may be separated in units of memory blocks.

In the above-described embodiments, the phenomenon in which the residual substance of the sacrificial film remains on the second region (R2) may be prevented, and therefore the driving gates (DG) may be patterned in a pattern in which the driving gates (DG) are separated from each other. When the dishing phenomenon described in FIG. 2B occurs, the driving gates (DG) may be formed at different heights in accordance with positions due to the dishing phenomenon, and in this case, resistance of the driving transistors may differ in accordance with the driving gates (DG).

Figure 3A:
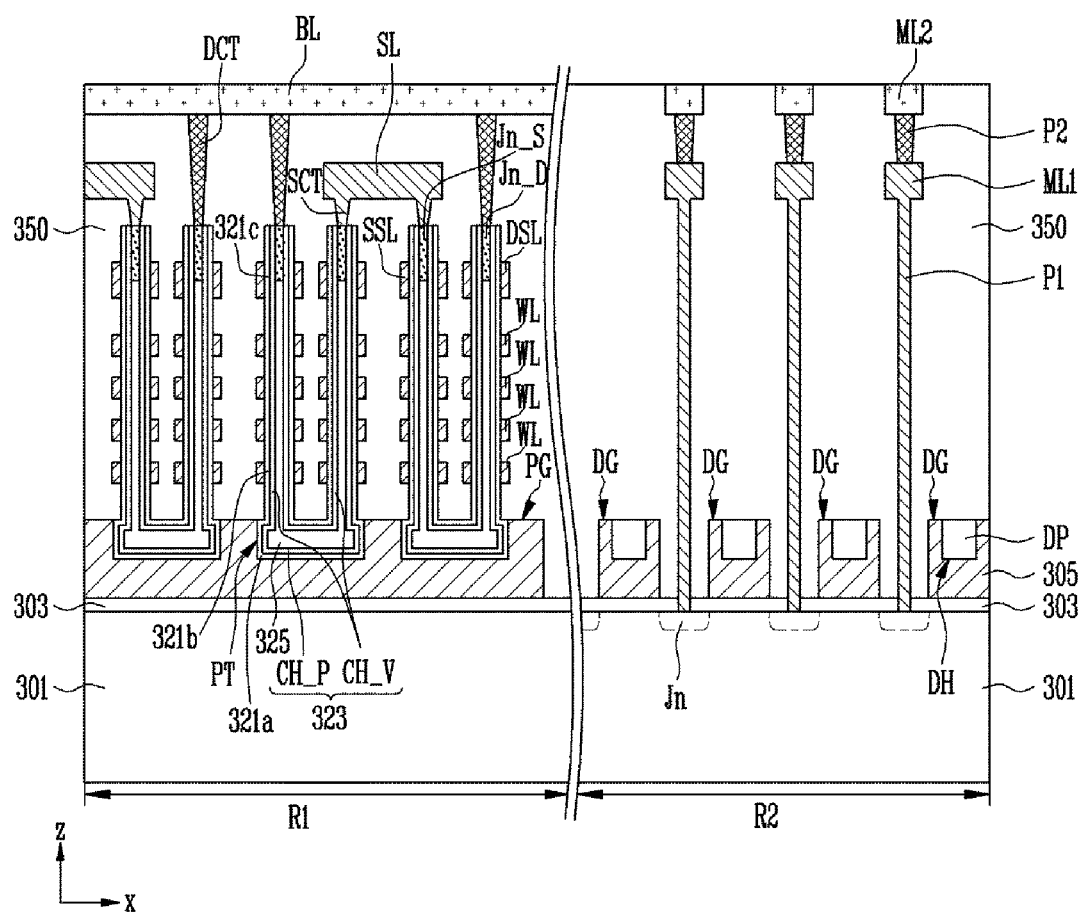
FIGS. 3A and 3B are cross-sectional views showing a 3D non-volatile memory device according to an embodiment.
Figure 3B:
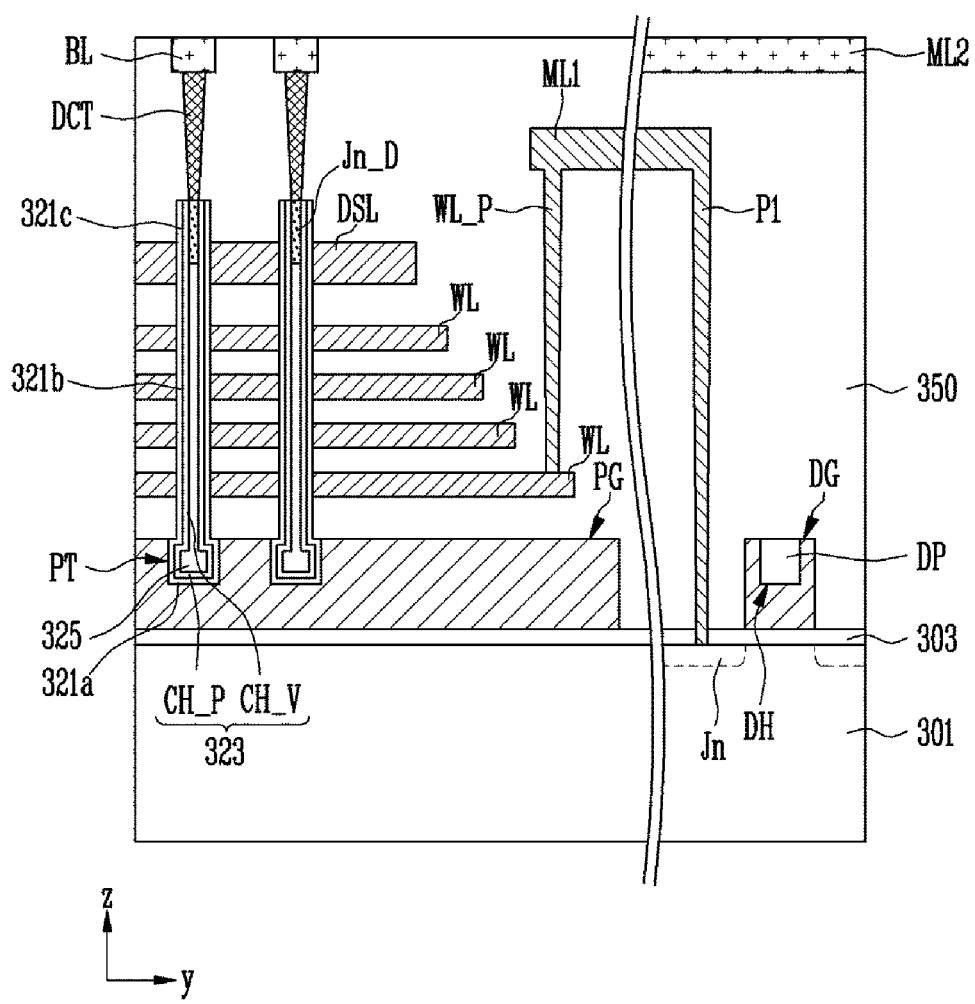

FIGS. 3A and 3B are cross-sectional views showing a 3D non-volatile memory device according to an embodiment. In particular, in FIGS. 3A and 3B, cross-sectional views which are orthogonal to each other in an xyz orthogonal coordinate system are shown. Hereinafter, an insulating film 350 which may be formed on the conductive film 305 is shown as a single layer, but the insulating film 350 may be configured with a plurality of insulating films, and for convenience of description, boundaries between the plurality of insulating films constituting the insulating film 350 are not shown.

Referring to FIG. 3A, a 3D non-volatile memory device according to an embodiment of the present invention may include a first region (R1) where a plurality of memory strings are arranged, and a second region (R2) where driving transistors for controlling the memory strings may be formed. The second region (R2) may be a peripheral region that substantially surrounds the first region (R1), and may be disposed adjacent to the first region (R1).

An insulating film 303 may be formed on a semiconductor substrate 301 in the first region (R1) and the second region (R2), and a conductive film 305 that may be patterned to a pipe gate (PG) and driving gates (DG) may be formed on the insulating film 303. The pipe gate (PG) may be formed in the first region (R1), and the driving gates (DG) may be formed in the second region (R2). The pipe gate (PG) may enclose a pipe channel film (CH_P). The driving gates (DG) may include dummy patterns (DP). In a region of the driving gates (DG) excluding a region where the dummy patterns (DP) may be formed, a contact region (not shown) is defined. The conductive film 305 may be divided into a first conductive film and a second conductive film. The first conductive film may contact a lower portion of each pipe channel film (CH_P) and the dummy patterns (DP). The second conductive film may contact a side wall of each pipe channel film (CH_P) and the dummy patterns (DP) and may be formed on the first conductive film. The conductive film 305 may be formed as an integrated film substantially enclosing a bottom surface and a side wall of each pipe gate (PG) and dummy patterns (DP).

The pipe channel film (CH_P) may be arranged in the first region (R1) in the form of a matrix, and is formed inside a pipe trench (PT) that is formed in the conductive film 305 to thereby be substantially surrounded by the conductive film 305. An outer wall surface of the pipe channel film (CH_P) or an inner surface of the pipe trench (PT)) may be substantially surrounded by a gate insulating film 321a. Accordingly, the gate insulating film 321a may be interposed between the pipe channel film (CH_P) and the pipe gate (PG). A pipe connection transistor may be defined in an intersection of the pipe gate (PG) and the pipe channel film (CH_P).

The dummy patterns (DP) may be formed on the second region (R2). The bottom surfaces and the side walls of the dummy patterns (DP) may be formed so as to contact the conductive film 305. For example, the dummy patterns (DP) may be formed inside dummy holes (DH) formed in the conductive film 305. The dummy holes (DH) may be formed on the same layer as that of the pipe trench (PT). The driving gates (DG) may include the contact regions that contact plugs (not shown) formed on the driving gates (DG). The dummy holes (DH) and the dummy patterns (DP) may be formed in a remaining region excluding the contact regions of the driving gates (DG). In addition, the dummy patterns (DP) may be made of a material having an etch selectivity with respect to the conductive film 305. Furthermore, the dummy patterns (DP) may be made of a material having an etch selectivity with respect to the insulating film 350 formed on the conductive film 305. For example, the dummy patterns (DP) may be made of a nitride film.

In an embodiment, the driving gates (DG) may have the dummy patterns (DP). For example, the dummy holes (DH) may be formed in the driving gates (DG) similarly to the pipe trenches (PT) formed in the pipe gate (PG). Therefore, in an embodiment, when simultaneously patterning the driving gates (DG) and the pipe gate (PG), a defect in the manufacturing process that occurs due to a difference in types between the driving gates (DG) and the pipe gate (PG) may be reduced. In addition, the dummy patterns (DP) included in the driving gates (DG) may be used as an etch stop layer or a patterning stop layer. A manufacturing process of the driving gates (DG) and the pipe gate (PG) according to an embodiment will be described in detail with reference to FIGS. 4A to 4D, or FIGS. 5A to 5D.

A structure formed on the driving gates (DG) and the pipe gate (PG) is not limited to a structure which will be described below, and any structure, which has been known, formed on the driving gates and the pipe gate of the 3D non-volatile memory device may be adopted.

Word lines (WL) may be stacked on the pipe gate (PG) of the first region (R1) so as to be separated, interposing the insulating film 350. The word lines (WL) may be formed as the conductive film, and extend substantially in parallel in one direction. The word lines (WL) may be formed so as to substantially enclose a vertical channel film (CH_V) that protrudes upward from the pipe channel film (CH_P). An outer wall surface of the vertical channel film (CH_V) that crosses the word lines (WL) may be substantially surrounded by a multi-layered film 321b on which a tunnel insulating film, a charge trap film, and a charge blocking film may be laminated. Accordingly, the multi-layered film 321b may be interposed between the vertical channel film (CH_V) and the word lines (WL). A memory cell transistor is defined in an intersection of the vertical channel film (CH_V) and the word lines (WL).

The tunnel insulating film may be a film that is formed so as to contact the vertical channel film (CH_V), and may be made of a silicon oxide. The charge trap film may be a film that is formed so as to contact an outer wall of the tunnel insulating film, and may be made of a silicon nitride film capable of charge trapping. The charge blocking film may be a film that may be formed so as to contact an outer wall of the charge trap film, and may be made of a material having a higher dielectric constant than that of the charge trap film, such as a silicon oxide.

A select line (SSL or DSL) may be formed on word lines (WL) in the first region (R1). A space between the word lines (WL) and the select line (SSL or DSL) may be filled with the insulating layer 350. The select line (SSL or DSL) may be formed as the conductive film, and may extend substantially along the same direction as that of the word lines (WL). The select line (SSL or DSL) may be formed so as to substantially enclose the vertical channel film (CH_V). An outer wall surface of the vertical channel film (CH_V) that crosses the select line (SSL or DSL) may be substantially surrounded by the gate insulating film 321c. Accordingly, the gate insulating film 321c may be interposed between the vertical channel film (CH_V) and the select line (SSL or DSL). A select transistor may be defined in an intersection of the vertical channel film (CH_V) and the select line (SSL or DSL).

A pair of vertical channel films (CH_V) are connected to the pipe channel film (CH_P). The pipe channel film (CH_P) and the pair of vertical channel films (CH_V) connected to the pipe channel film (CH_P) constitutes a U-shaped channel film 323 of the memory string. The select line that encloses one of the vertical channel films (CH_V) connected by the pipe channel film (CH_P) may be defined as a drain selection line (DSL), and the select line that encloses the other one may be defined as a source selection line (SSL). A space between the drain select line (DSL) and the source select line (SSL) may be filled with the insulating film 350. In addition, spaces between the word lines (WL) below the drain select line (DSL) and the word lines (WL) below the source select line (SSL) may be filled with the insulating film 350. In addition, the drain select line (DSL), the source select line (SSL), and the word lines (WL) which respectively substantially enclose the U-shaped channel films 323 neighboring each other may be separated by the insulating film 350. Additionally, the insulating film 350 may be formed between the drain select lines (DSL), the source select lines (SSL), and the word lines (WL), which substantially enclose each of the vertical channel films (CH_V) which neighbor each other while not being connected by the pipe channel film (CH_P). Also, although not shown, the drain selection lines (DSL), the source selection lines (SSL), and word lines (WL) which enclose each of the U-shaped channel films 323 neighboring each other may be connected while not being separated by the insulating film 350. Additionally, the vertical channel films (CH_V) which neighbor each other while not being connected by the pipe channel film (CH_P) may be substantially surrounded by a single drain selection line (DSL) that is not separated by the insulating film 350. In addition, the vertical channel films (CH_V) which neighbor each other while not being connected by the pipe channel film (CH_P) may be substantially surrounded by a single source selection line (SSL) that is not separated by the insulating film 350. In addition, the vertical channel films (CH_V) which neighbor each other while not being connected by the pipe channel film (CH_P) may be substantially surrounded by the word lines (WL) which are not separated by the insulating film 350.

The gate insulating films 321a and 321c and the multi-layered film 321b may be made of the same material, and may be integrally formed. In addition, the U-shaped channel film 323 may be formed in a hollow tube shape. In this case, the insulating film 325 may be embedded inside the U-shaped channel film 323. A material film for junction (Jn_S and Jn_D) may be embedded in an upper end of the tube formed as the U-shaped channel film 323. The material film for junction (Jn_S and Jn_D) may be formed as a doped polysilicon film. The junction (Jn_S and Jn_D) includes a drain junction (Jn_D) of a drain select transistor, and a source junction (Jn_S) of a source select transistor.

A source contact (SCT) may be formed on the source junction (Jn_S), and a source line (SL) may be formed on the source contact (SCT). A drain contact (DCT) may be formed on the drain junction (Jn_D), and a bit line (BL) may be formed on the drain contact (DCT). Spaces between the source contact (SCT) and the drain contact (DCT), between the source contact (SCT) and the bit line (BL), and between the drain contact (DCT) and the source line (SL) may be filled with the insulating film 350. The source junction (Jn_S) may be connected to the source line (SL) through the source contact (SCT), and the drain junction (Jn_D) may be connected to the bit line (BL) through the drain contact (DCT). The bit line (BL) may extend in a direction which crosses the word line (WL).

A plurality of memory cells which are connected in series by the U-shaped channel film 323 between the bit line (BL) and the source line (SL), and a pair of selection lines may constitute the memory string.

Both ends of the word lines (WL) and the selection lines (DSL or SSL) may be patterned in the form of steps that protrude more the closer they get to a lower layer. Therefore, conductive plugs (for example, WL_P) that penetrate the insulting film 350 above the word lines (WL) and the selection lines (DSL or SSL) may be connected to each layer of the word lines (WL) and the selection lines (DSL or SSL).

Junctions (Jn) to which trivalent or pentavalent impurities that are injected may be formed inside the semiconductor substrate 301 on both ends of the driving gates (DG) in the second region (R2). The junctions (Jn) formed on both ends of the driving gates (DG) may be used as a source junction or a drain junction of the driving transistors. The insulating film 350 may be formed on the junctions (Jn) and the driving gates (DG). A space between the junctions (Jn) may become a channel region of the driving transistors. The junctions (Jn), the channel region, the insulting film 303, and the driving gates (DG) may constitute the driving transistors.

The insulating film 350 may be formed on the junctions (Jn) and the driving gates (DG) in the second region (R2). Conductive patterns (P1, ML1, P2, and ML2) which penetrate the insulating film 350 may be connected to contact regions of the junctions (Jn) and the driving gates (DG). The conductive patterns (P1, ML1, P2, and ML2) may be formed in a stacked structure of the multi-layered conductive plugs (P1 and P2) and the multi-layered conductive wirings (ML1 and ML2) depending on a layout design of components to be formed in the second region (R2).

The driving transistors formed in the second region (R2) may be components constituting peripheral circuits. For example, at least one of the driving transistors may be connected to the memory string formed in the first region (R1). Additionally, at least one of the driving transistors may be connected to one of the word lines (WL) formed in the first region (R1). For this, the conductive plug (P1) connected to the junction (Jn) of the driving transistor and the conductive plug (WL_P) connected to the word line (WL) may be electrically connected by the conductive wiring (ML1).

Hereinafter, a manufacturing method of the 3D non-volatile memory device described with reference to FIGS. 3A and 3B will be described.

FIGS. 4A to 4D are cross-sectional views showing a manufacturing method of a 3D non-volatile memory device according to an embodiment.

Figure 4A:
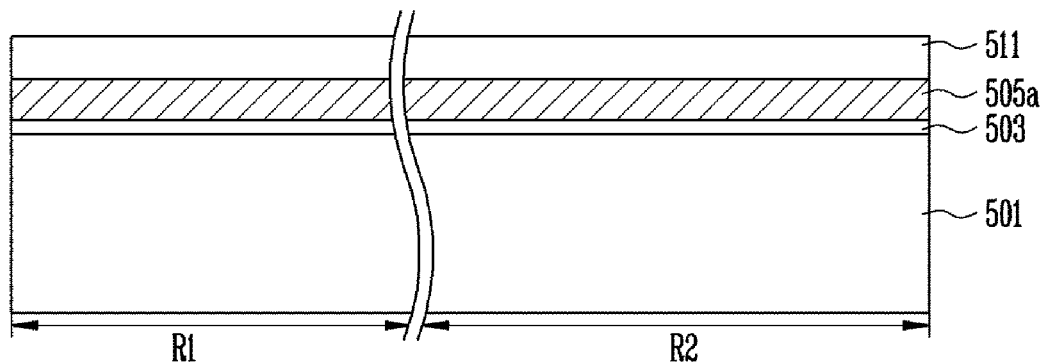
FIGS. 4A to 4D are cross-sectional views showing a manufacturing method of a 3D non-volatile memory device according to an embodiment.

Referring to FIG. 4A, an insulating film 503 and a first conductive film 505a may be laminated on a semiconductor substrate 501 including a first region (R1) and a second region (R2). The insulating film 503 may insulate a space between the semiconductor substrate 501 and a pipe gate, or may be used as a gate insulating film of the driving transistor. The insulating film 503 may be formed as a silicon oxide film. The first conductive film 505a may be used for forming the pipe gate and the driving gate, and may be formed as at least one of a doped silicon film on which impurities are doped, a metal film, and a metal silicide film.

Next, a sacrificial film 511 may be formed on the first conductive film 505a in the first region (R1). The sacrificial film 511 may be made of a material having an etch selectivity with respect to a second conductive film, which is to be formed in the subsequent process, and the insulting film. For example, the sacrificial film 511 may be made of a nitride.

Figure 4B:
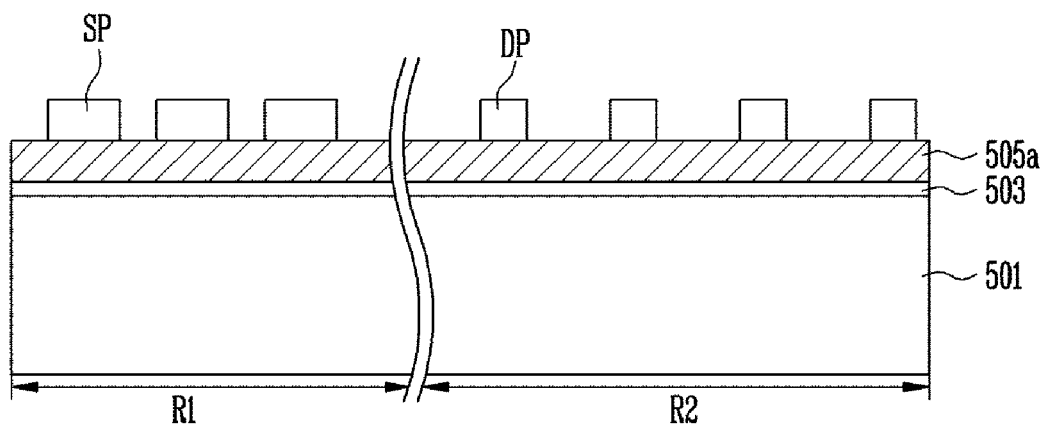

Referring to FIG. 4B, sacrificial patterns (SP) may be formed on the first conductive film 505a in the first region (R1) by patterning the sacrificial film 511, and dummy patterns (DP) may be formed on the first conductive film 505a in the second region (R2). The sacrificial patterns (SP) may be arranged in the form of a matrix that may be composed of a plurality of columns and a plurality of lines. The dummy patterns (DP) may be arranged while avoiding contact regions of the driving gates. The sacrificial patterns (SP) may be patterns which define a region in which the pipe channel film (CH_P) and the gate insulating film 321a which are shown in FIGS. 3A and 3B are to be formed.

Figure 4C:
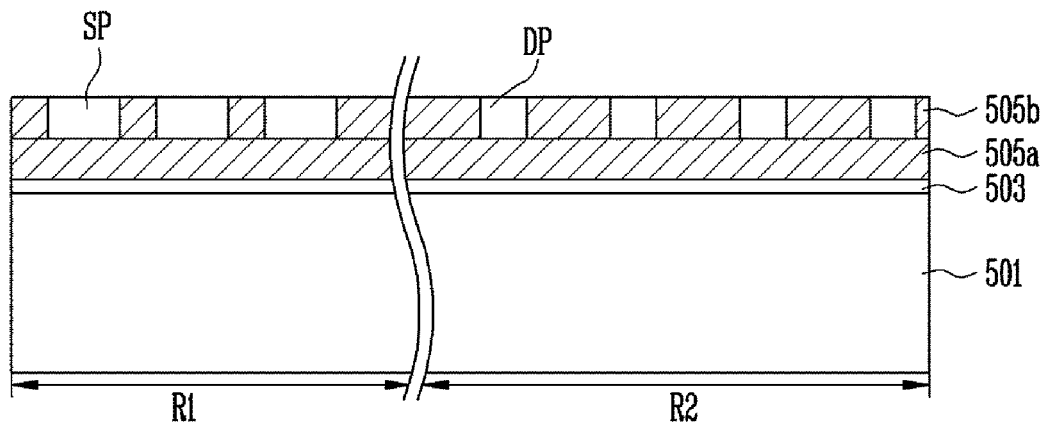

Referring to FIG. 4C, the second conductive film 505b may be formed so that spaces between the sacrificial patterns (SP), dummy patterns (DP), and the sacrificial pattern (SP) and the dummy pattern (DP) may be completely filled with the second conductive film 505b. The second conductive film 505b may be used for forming a conductive film for the pipe gate and the driving gates similarly to the first conductive film 505a, and may be made of at least one of a doped silicon film on which impurities are doped, a metal film, and a metal silicide film.

After the second conductive film 505b is formed, a flattening process may be performed until the sacrificial patterns (SP) and the dummy patterns (DP) are exposed. In this instance, the sacrificial patterns (SP) exist on the first region (R1), and the dummy patterns (DP) which may be made of the same material as that of the sacrificial patterns (SP) may be formed on the second region (R2). Accordingly, in an embodiment, a dishing phenomenon in which a surface of the second conductive film 505b on the second region (R2) is recessed may be prevented.

A conductive stack structure that includes the first and second conductive films 505a and 505b and encloses the sacrificial patterns (SP) and the dummy patterns (DP) may be formed through the above-described flattening process.

Figure 4D:
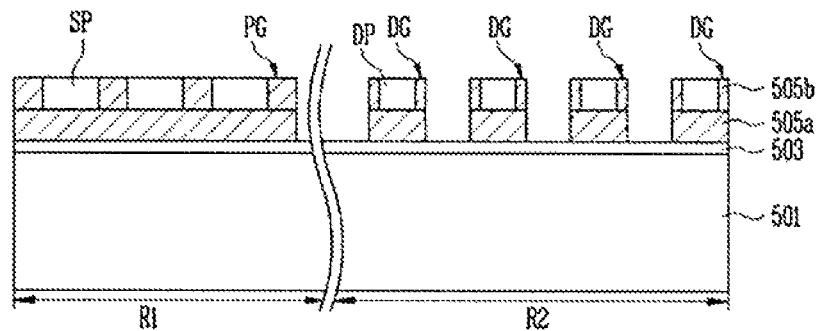

Referring to FIG. 4D, an etching process for patterning the first conductive film 505a and the second conductive film 505b is performed. Therefore, the pipe gate (PG) which substantially encloses the sacrificial patterns (SP) may be formed in the first region (R1), and the driving gates (DG) having the dummy patterns (DP) may be formed in the second region (R2). The pipe gate (PG) and the driving gates (DG) may be simultaneously formed by etching the first and second conductive films 505a and 505b. The pipe gate (PG) may be a pattern that is separated in units of memory blocks. In an embodiment, the dishing phenomenon in which a surface of the second conductive film 505b of the driving gates (DG) is recessed may be prevented. Accordingly, in an embodiment, uniformity of the driving gates (DG) may be improved, and therefore the height of each of the driving gates (DG) may be uniformly formed.

Accordingly, in an embodiment, resistance uniformity of the driving transistors according to the driving gates (DG) may be improved.

An example of a subsequent process performed after forming the pipe gate (PG) and the driving gate (DG) will be described below.

The pipe gate (PG) enclosing the sacrificial patterns (SP) and the driving gates (DP) having the dummy patterns (DP) are formed, and then the junction (Jn) shown in FIGS. 3A and 3B may be formed by injecting impurities into the semiconductor substrate 501 on both ends of the driving gates (DG).

Next, first material films and second material films may be alternately stacked on the entire structure including the pipe gate (PG) and the driving gates (DG) may be formed, and then, substantially vertical holes that penetrate the first and second material films formed on the first region (R1) to thereby expose the sacrificial patterns (SP) may be formed. The first material films may be a conductive film for the word lines (WL) and the select line (DSL or SSL) which are shown in FIGS. 3A and 3B, and the second material films may be a part of the insulating film 350.

Next, the sacrificial patterns (SP) exposed through the substantially vertical holes may be completely removed by an etching process. Multi-layered films 321a, 321b, and 321c in which a charge blocking film, a charge trap film, and a tunnel insulating film may be laminated and may be formed along a removal region of the sacrificial patterns (SP) and surfaces of the vertical holes. A semiconductor film may be formed inside the removal region coated with the multi-layered films 321a, 321b, and 321c and the vertical holes, and thereby may form the pipe channel film (CH_P) and the vertical channel films (CH_V).

FIGS. 5A to 5D are cross-sectional views showing another manufacturing method of the 3D non-volatile memory device described with reference to FIGS. 3A and 3B.

Figure 5A:
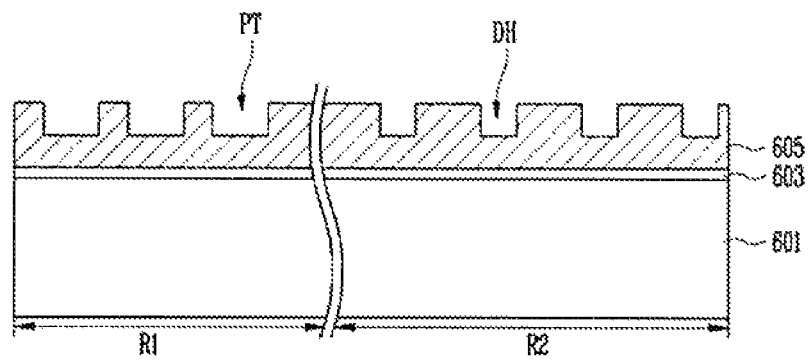
FIGS. 5A to 5D are cross-sectional views showing another manufacturing method of a 3D non-volatile memory device according to an embodiment.

Referring to FIG. 5A, as described in FIG. 4A, an insulating film 603 may be formed on a semiconductor substrate 601 including a first region (R1) and a second region (R2). Next, a conductive film 605 may be formed on the insulating film 603. The conductive film 605 may be used for forming a pipe gate and a driving gate, and may be made of at least one of a doped silicon film on which impurities are doped, a metal film, and a metal silicide film.

Next, pipe trenches (PT) may be formed on the conductive film 605 on the first region (R1) by etching the conductive film 605, and dummy holes (DH) may be formed on the conductive film 605 on the second region (R2). The pipe trenches (PT) may be arranged in the form of a matrix that may be composed of a plurality of columns and a plurality of lines. The dummy holes (DH) may be formed while avoiding the contact regions of the driving gates. The pipe trenches (PT) may be a region where the pipe channel film (CH_P) and the gate insulating film 321a which are shown in FIGS. 3A and 3B are to be formed. A difference in density of etching regions (that is, PT and DH) which may be formed on the first and second regions R1 and R2 may be adjusted by changing the arrangement of the dummy holes (DH), so that a residual substance of the sacrificial film does not remain on the second region (R2) when performing a subsequent flattening process of the sacrificial film.

The dummy holes (DH) and the pipe trenches (PT) may be formed in such a manner that a hard mask pattern may be formed on the conductive film 605, and then the conductive film 605 may be etched by an etching process in which the hard mask pattern may be used as an etch barrier to thereby remove the hard mask pattern. The hard mask pattern may be formed by a patterning process using a photolithography process, or formed as a photoresist pattern.

Figure 5B:
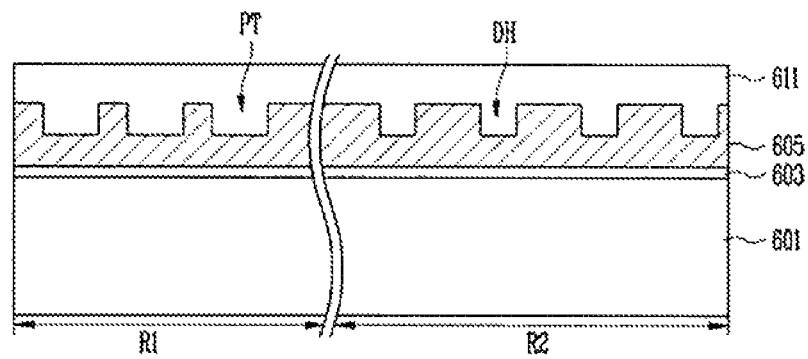

Referring to FIG. 5B, a sacrificial film 611 may be formed on the entire structure including the pipe trenches (PT) and the dummy holes (DH) so that the pipe trenches (PT) and the dummy holes (DH) may be completely filled with the sacrificial film 611. In this instance, the sacrificial film 611 may be made of a material having an etch selectivity with respect to the conductive film 605 and an insulating film (for example, 350 of FIG. 3) which will be formed in a subsequent process. For example, the sacrificial film 611 may be made of a nitride.

Figure 5C:
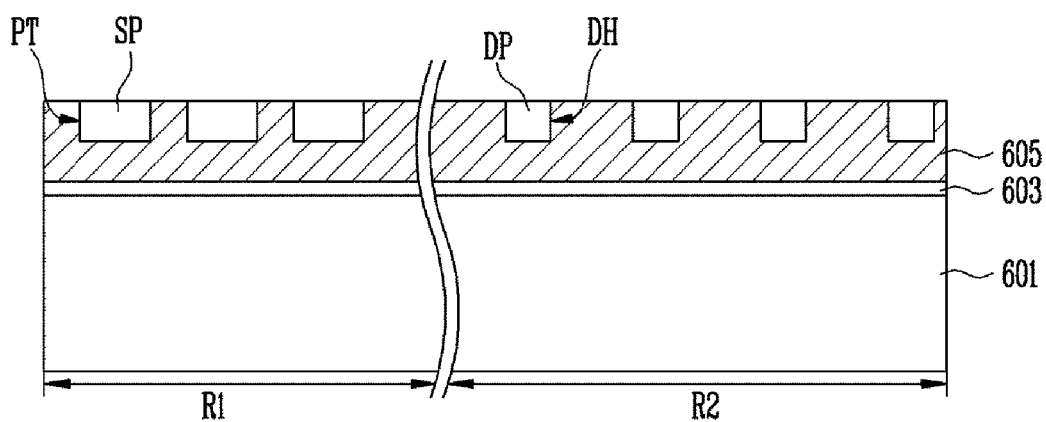

Referring to FIG. 5C, the sacrificial film 611 may be flattened. Therefore, the sacrificial film 611 may remain inside the pipe trenches (PT) on the first region (R1) as the sacrificial pattern (SP), and may remain inside the dummy hole (DH) on the second region (R2) as the dummy pattern (DP). Accordingly, the conductive film 605 which substantially encloses the sacrificial patterns (SP) and the dummy patterns (DP) may be formed. A flattening process of the sacrificial film 611 may be performed in a state in which the pipe trenches (PT) may be formed in the conductive film 605 in the first region (R1), and the dummy holes (DH) may be formed in the conductive film 605 in the second region (R2). As a result, in an embodiment, a phenomenon in which a residual substance of the sacrificial film 611 remains on the second region (R2) through the dummy hole (DH) when performing the flattening process of the sacrificial film 611 may be reduced, and pattern defects due to the residual substance of the sacrificial film 611 may be reduced.

Figure 5D:
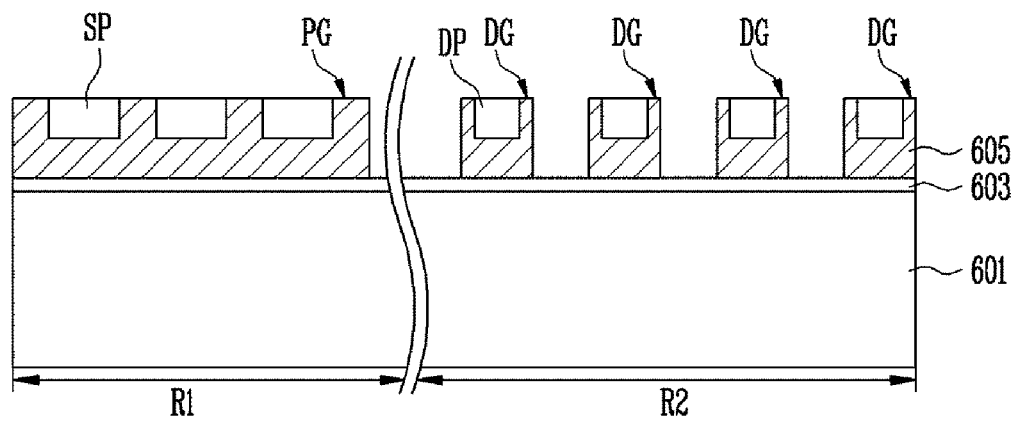

Referring to FIG. 5D, an etching process for patterning the conductive film 605 may be performed. Therefore, the pipe gate (PG) substantially enclosing the sacrificial patterns (SP) may be formed on the first region (R1), and the driving gates (DG) including the dummy patterns (DP) may be formed on the second region (R2). The pipe gate (PG) and the driving gates (DG) may be substantially simultaneously formed by etching the conductive film 605. The pipe gate (PG) may be a pattern that is separated in units of memory blocks.

An example of a subsequent process performed after forming the pipe gate (PG) and the driving gate (DG) is substantially the same as that described in FIG. 4D.

FIGS. 6A to 10D are perspective views showing a part of a driving gate for describing a variety of types of driving gates according to an embodiment. In particular, FIGS. 6A, 7A, 8A, 9A, and 10A are driving gates formed by the manufacturing method described in FIGS. 4A to 4D. FIGS. 6B, 7B, 8B, 9B, and 10B are driving gates formed by the manufacturing method described in FIGS. 5A to 5D.

Referring to FIGS. 6A to 10B, a contact region (CR) may be defined in a region of the driving gate (DG) excluding a region where the dummy pattern (DP) may be formed. The dummy pattern (DP) may include holes that expose the contact region (CR), or may be formed so as to be embedded inside the dummy hole (DH). The dummy pattern (DP) may be formed in a variety of shapes such as a cylinder, a square pillar, a polyprism, or an elliptic cylinder to thereby be substantially surrounded by the driving gate (DG). In addition, the driving gate (DG) extends so as to protrude substantially toward a first part (A) that may be formed on an active region of the semiconductor substrate or toward a side surface of the first part (A), and may include a second part (B) that may be formed on an isolation region of the semiconductor substrate. In an active region of both sides of the first part (A), junctions (Jn) which have been described with reference to FIGS. 3A and 3B may be formed.

Referring to FIGS. 6A, 7A, 8A, 9A, and 10A, the dummy pattern (DP) may be formed in substantially the same method as that described in FIGS. 4A to 4D. That is, the driving gate (DG) may be formed in such a manner that the dummy patterns (DP) may be formed on the first conductive film 505a, the second conductive film 505b that substantially encloses at least one side surface of the dummy patterns (DP) may be formed on the first conductive film 505a while filling spaces between the dummy patterns (DP) with the second conductive film 505b, and the second conductive film 505b and the first conductive film 505a are patterned. In this instance, the contact region (CR) may be defined by the second conductive film 505b of the driving gate (DG) that may be formed on the first conductive film 505a.

Figure 6A:
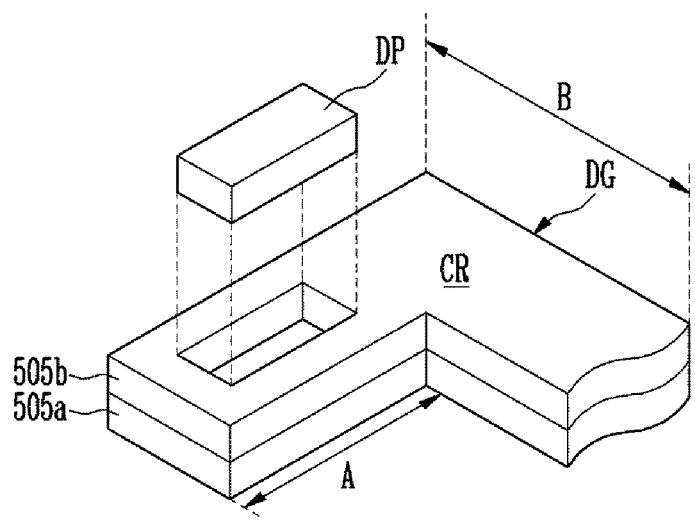
FIGS. 6A to 10B are perspective views showing a part of a driving gate for describing a variety of types of driving gates according to an embodiment.
Figure 7A:
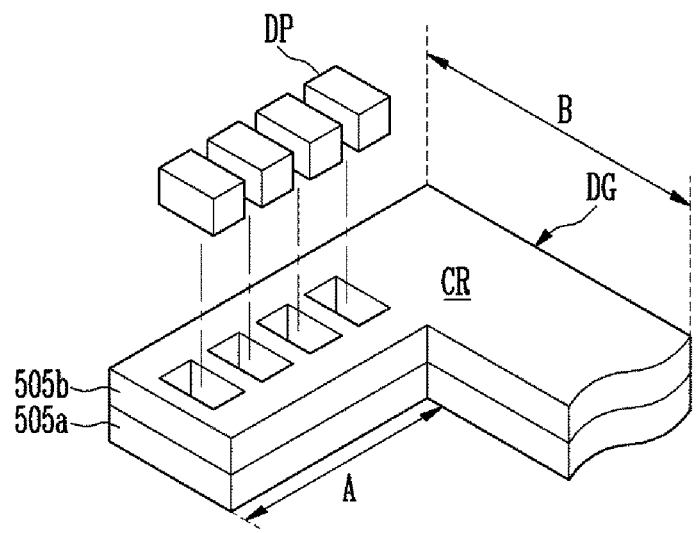
Figure 8A:
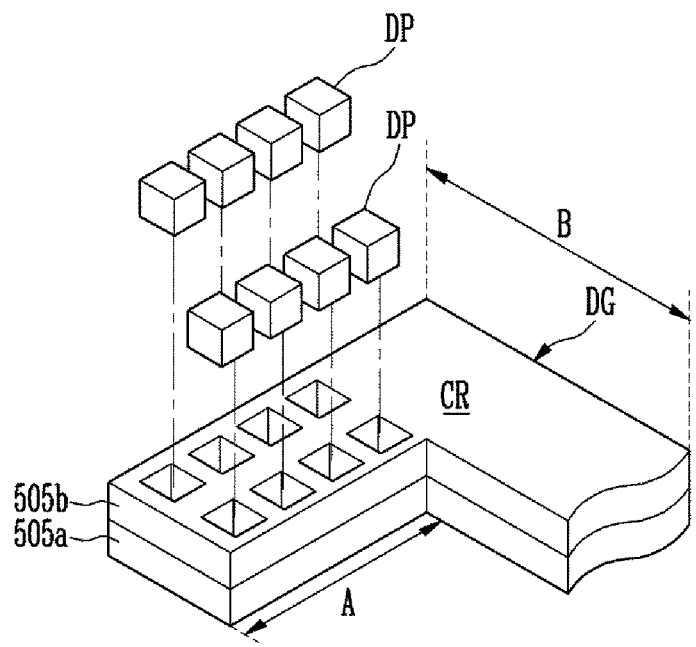
Figure 9A:
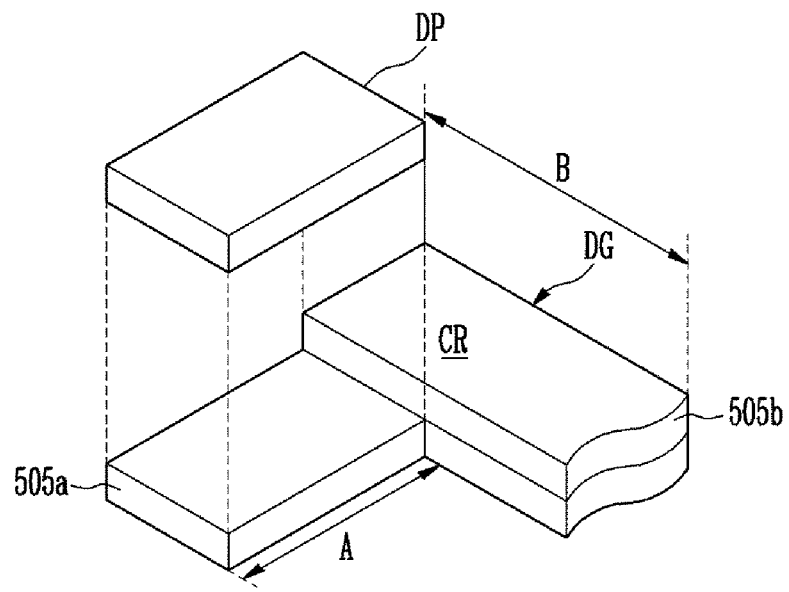

The dummy pattern (DP) may be formed to have a smaller size than that of the first conductive film 505a of the driving gate (DG) as shown in FIGS. 6A, 7A, 8A, and 9A. For example, as shown in FIG. 6A, one dummy pattern (DP) may be formed to have a smaller size than that of the first part (A) of the driving gate (DG), and may be disposed in the first part (A) of the driving gate (DG). Alternately, as shown in FIG. 7A, a plurality of dummy patterns (DP) which may be arranged in a row may be disposed in the first part (A) of the driving gate (DG). In this instance, the dummy patterns (DP)

may not be disposed in a row, but disposed in the form of a zigzag. Alternately, as shown in FIG. 8A, the dummy patterns (DP) may be disposed in the first part (A) of the driving gate (DG) in the form of a matrix. Alternatively, as shown in FIG. 9A, one dummy pattern (DP) may be formed to have the same size as that of the first part (A) of the driving gate (DG) to thereby be disposed in the first part (A) of the driving gate (DG).

Figure 10A:
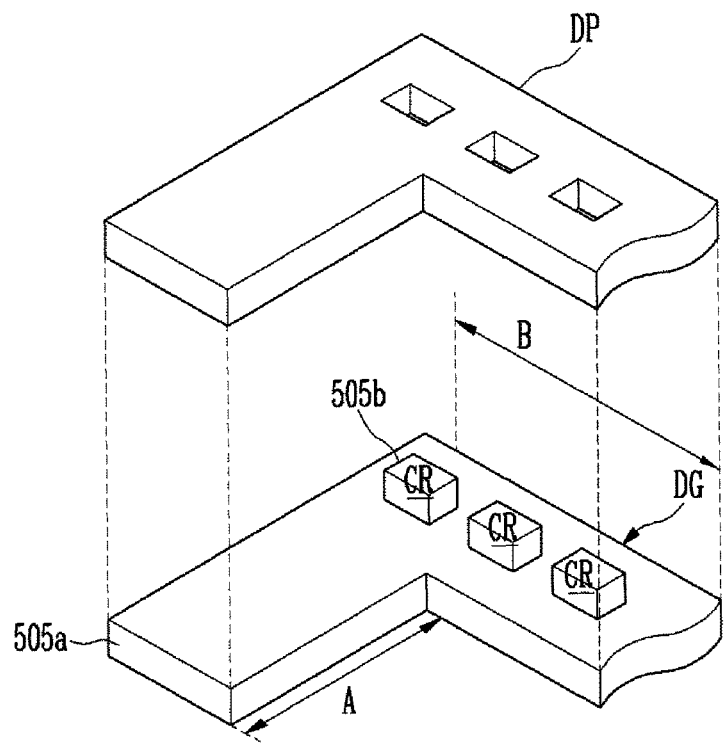

Alternatively, as shown in FIG. 10A, the contact region (CR) of the driving gate (DG) may be disposed on the first conductive film 505a. The dummy pattern (DP) may include a hole that exposes the contact region (CR), and may be formed to have the same size as that of the first conductive film 505a of the driving gate (DG).

Referring to FIGS. 6B, 7B, 8B, 9B, and 10B, the dummy pattern (DP) may be formed in the same manner as that described in FIGS. 5A to 5D. That is, the driving gate (DG) may be formed in such a manner that the conductive film 605 is formed, the dummy hole (DH) is formed by etching the conductive film 605, the dummy pattern (DP) is embedded inside the dummy hole (DH), and then the conductive film 605 is patterned. In this instance, the contact region (CR) may be a partial region of the conductive film 605 that may be exposed by the dummy pattern (DP).

Figure 6B:
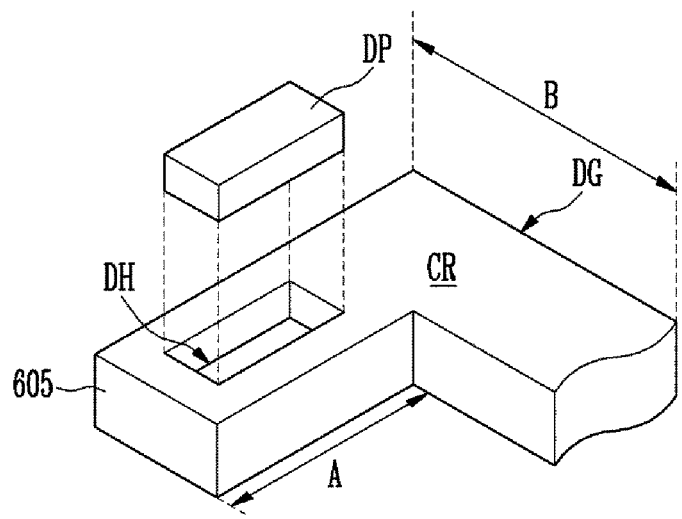
Figure 7B:
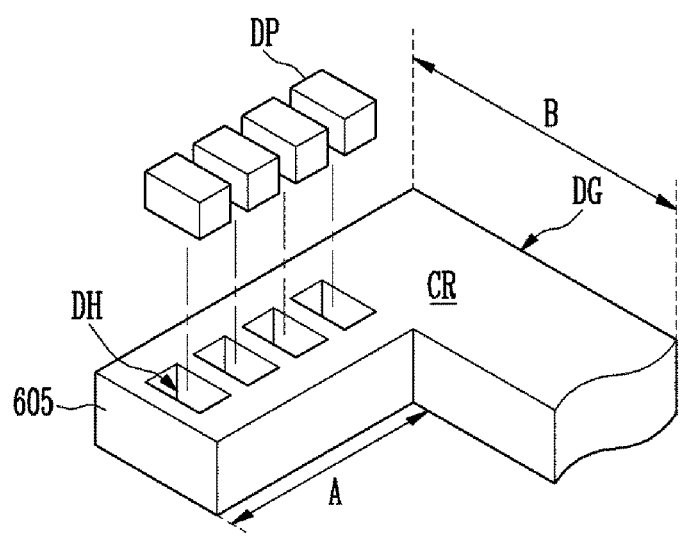
Figure 8B:
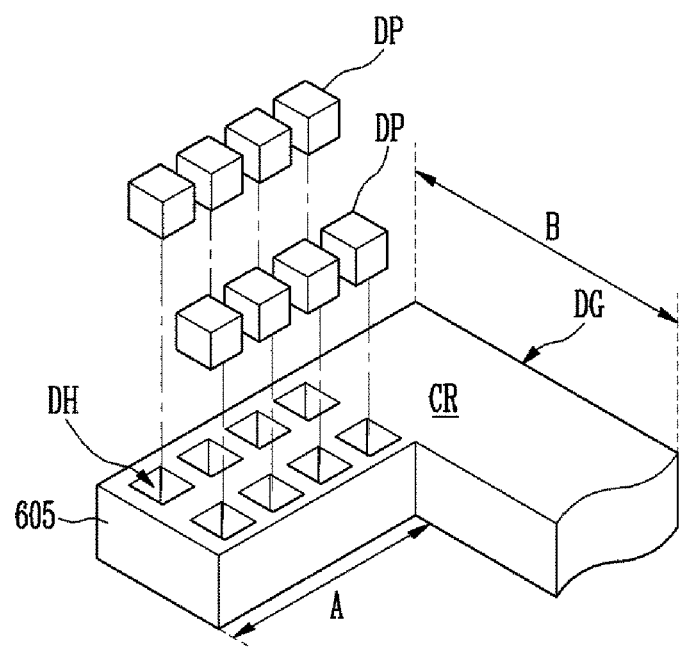

The dummy pattern (DP) may be formed to have a smaller size than that of the first part (A) of the driving gate (DG), as shown in FIGS. 6B, 7B, and 8B. For example, as shown in FIG. 6B, one dummy pattern (DP) may be formed to have a smaller size than that of the first part (A) of the driving gate (DG) to thereby be disposed in the first part (A). Alternatively, a plurality of dummy patterns (DP) which may be arranged in a row as shown in FIG. 7B, may be disposed in the first part (A) of the driving gate (DG). In this instance, the dummy patterns (DP) are not arranged in a row, but substantially in the form of a zigzag. Alternatively, as shown in FIG. 8B, the plurality of dummy patterns (DP) may be disposed in the first part (A) in the form of a matrix.

Figure 9B:
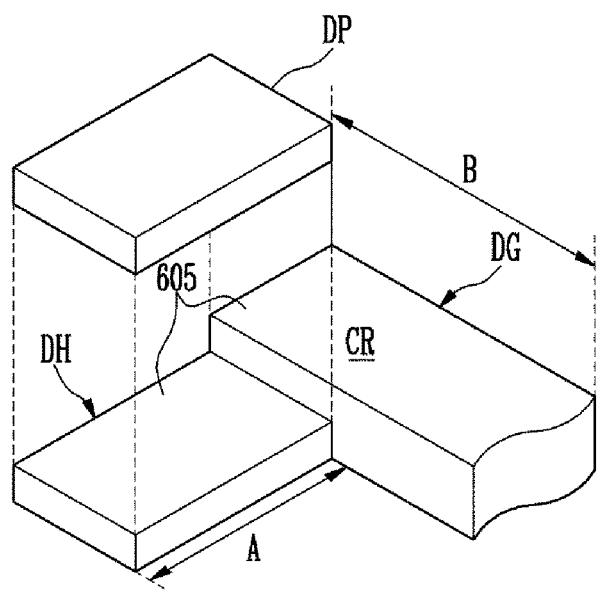

In addition, as shown in FIG. 9B, one dummy pattern (DP) may be formed to have the same size as that of the first part (A) of the driving gate (DG) to thereby be disposed in the first part (A) of the driving gate (DG).

Figure 10B:
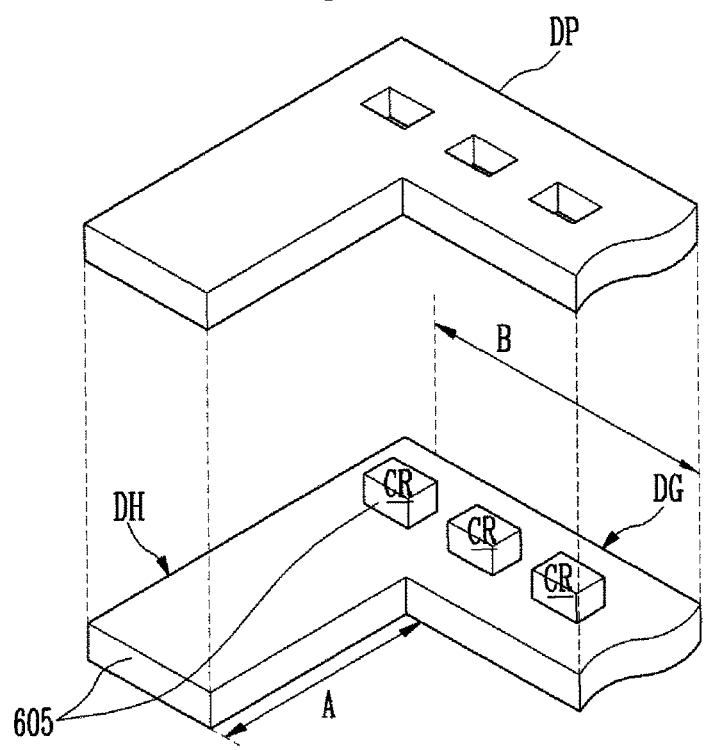

In addition, as shown in FIG. 10B, the dummy pattern (DP) may include a hole that exposes the contact region (CR) of the driving gate (DG), and may be formed to have the same size as that of the driving gate (DG). The contact region (CR) may be a region that is not etched by being protected by the mask pattern when performing an etching process of the conductive film 605 for forming the dummy hole (DH), and may protrude from the conductive film 605 of a bottom surface of the dummy hole (DH) to thereby remain.

Figure 11:
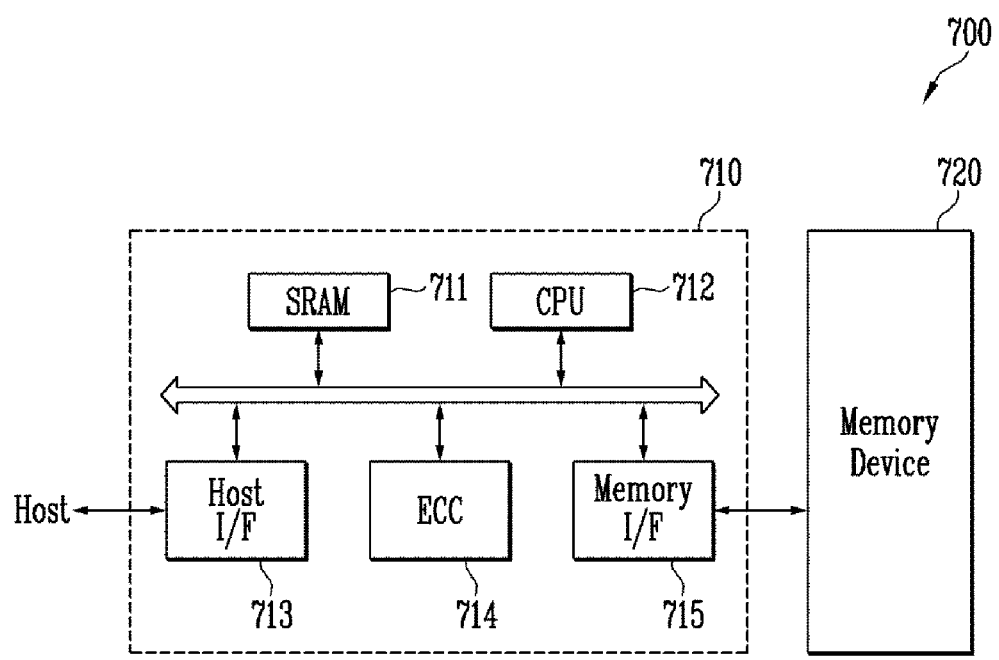
FIG. 11 is a block diagram briefly showing a memory system according to an embodiment.

FIG. 11 is a block diagram briefly showing a memory system according to an embodiment.

Referring to FIG. 11, a memory system 700 according to the present invention includes a memory device 720 and a memory controller 710.

The memory device 720 may include the 3D non-volatile memory device described in FIGS. 3A and 3B. That is, the memory device 720 may include a non-volatile memory device including a pipe connection transistor that may be formed on a first region of a semiconductor substrate, and a driving transistor that may be formed on a second region of the semiconductor substrate. The pipe connection transistor may include a pipe gate that may be formed on the first region of the semiconductor substrate, and a pipe channel film that may be embedded inside the pipe gate. The driving transistor may be formed on the second region of the semiconductor substrate, and may include a driving gate having a dummy pattern.

In addition, the memory device 720 may further include a semiconductor storage element (for example, DRAM device and/or SRAM device).

The memory controller 710 may control data exchanged between a host and the memory device 720. The memory controller 710 may include a processing unit 712 that controls the entire operation of a memory system 700. In addition, the memory controller 710 may include an SRAM 711 that is used as an operation memory of the processing unit 712. Furthermore, the memory controller 710 may further include a host interface 713 and a memory interface 715. The host interface 713 may include a data exchange protocol between the memory system 700 and the host. The memory interface 715 may connect the memory controller 710 and the memory device 720. Furthermore, the memory controller 710 may further include an error correction block (ECC) 714. The error correction block 714 may detect and correct errors of data read from the memory device 720. Although not shown, the memory system 700 may further include an ROM device that stores code data for interfacing with the host. The memory system 700 may be used as a portable data storage card. Unlike this, the memory system 700 may be implemented as a Solid State Disk (SSD) that substitutes for hard disks of a computer system.

As described above, according to the various embodiments of the present invention, a dummy pattern may be formed in the second region where the driving gate may be formed while the sacrificial pattern may be formed in the first region where the pipe gate may be formed, thereby reducing a phenomenon in which the conductive film of the driving gate is damaged. Accordingly, according to the embodiments, reliability of a manufacturing process of the 3D non-volatile memory device including the pipe gate may be improved. In addition, uniformity of the conductive film may be improved by preventing the conductive film of the driving gate from being damaged, thereby improving uniformity of resistance characteristics of the driving transistor. Additionally, a defect of the driving gate may be reduced by preventing the conductive film of the driving gate from being damaged, thereby reducing resistance errors of the driving gates.

In the drawings and specification, there have been disclosed various embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A 3D non-volatile memory device comprising:
   a substrate that includes a first region and a second region;
   a pipe channel film that is formed on the substrate in the first region;
   a pipe gate that has a first concave portion filled with the pipe channel film; and
   a driving gate that is formed on the substrate in the second region, and has at least one second concave portion filled with at least one dummy pattern,
   wherein the first concave portion and the second concave portion are formed on a same layer.

2. The 3D non-volatile memory device of claim 1, wherein the driving gate and the pipe gate are formed on a same layer.

3. The 3D non-volatile memory device of claim 1, wherein the dummy pattern is made of a material having an etch selectivity with respect to a conductive film for the driving gate and the pipe gate.

4. The 3D non-volatile memory device of claim 1, wherein, in a region of the driving gate excluding a region where the dummy pattern is formed, a contact region is defined.

5. The 3D non-volatile memory device of claim 4, wherein the dummy pattern is embedded inside the driving gate excluding the contact region to thereby be substantially formed in a shape of a cylinder, a square pillar, a polyprism, or an elliptic cylinder, or includes a contact hole exposing the contact region to thereby be formed to have substantially the same size as that of the driving gate.

6. The 3D non-volatile memory device of claim 1, further comprising:
a pair of vertical channel films that are connected to the pipe channel film, and protrude over the substrate; and
memory cells that are stacked along the pair of vertical channel films.

7. The 3D non-volatile memory device of claim 6, wherein each of the memory cells includes a word line that substantially encloses the vertical channel film.

8. The 3D non-volatile memory device of claim 7, further comprising;
a junction that is formed inside the substrate of a side portion of the driving gate; and
a conductive plug that connects the junction and the word line.

9. The 3D non-volatile memory device of claim 7, further comprising;
a multi-layered film substantially surrounding an outer wall surface of the vertical channel film that crosses the word line; and
the multi-layered film is interposed between the vertical channel film and the word line.

10. The 3D non-volatile memory device of claim 9, wherein the multi-layered film is laminated with a tunnel insulating film, a charge trap film, and a charge blocking film.

11. The 3D non-volatile memory device of claim 10, wherein the tunnel insulating film contacts the vertical channel film and the tunnel insulating film is formed of a silicon oxide.

12. The 3D non-volatile memory device of claim 1, wherein the dummy pattern and the pipe channel film are formed on a same layer.

13. A manufacturing method of a 3D non-volatile memory device, comprising:
simultaneously forming, on a substrate, a pipe gate that is disposed in a first region and has a first concave region filled with a sacrificial pattern, and a driving gate that is disposed in a second region and has at least one second concave region filled with at least one dummy pattern, wherein the first concave region and the second concave region are formed on a same layer;
removing the sacrificial pattern; and
forming a pipe channel film in a region where the sacrificial pattern is removed.

14. The manufacturing method of claim 13, wherein the simultaneously forming includes:
forming a first conductive film on the substrate,
forming a sacrificial film on the first conductive film;
patterning the sacrificial film to form a plurality of sacrificial patterns in the first region and to form a plurality of dummy patterns in the second region,
filling, with a second conductive film, spaces between the sacrificial patterns and the dummy patterns, and
forming the pipe gate and the driving gate by patterning the second conductive film and the first conductive film.

15. The manufacturing method of claim 13, wherein the simultaneously forming includes:
forming a conductive film on the substrate,
etching the conductive film to form a plurality of pipe trenches in the first region and to form a plurality of dummy holes in the second region,
filling the plurality of pipe trenches and the plurality of dummy holes with a sacrificial film, and
patterning the conductive film.

16. The manufacturing method of claim 13, wherein each sacrificial pattern and dummy pattern is made of a material having an etch selectivity with respect to a conductive film for the pipe gate and the driving gate.

17. The manufacturing method of claim 13, wherein the removing includes:
alternately stacking first material films and second material films on an entire structure including the pipe gate and the driving gate,
forming a vertical hole that exposes the sacrificial pattern by penetrating the first material films and the second material films, and
removing the sacrificial pattern exposed through the vertical hole.

18. The manufacturing method of claim 17, wherein, after the removing of the sacrificial pattern, the removing further includes:
stacking a charge blocking film, a charge trap film, and a tunnel insulating film on a surface of a region where the vertical hole and the sacrificial pattern are removed.

19. The manufacturing method of claim 18, wherein, after the forming of the tunnel insulating film,
a semiconductor film is formed in the region where the vertical hole and the sacrificial pattern are removed, thereby forming a vertical channel film within the vertical hole and the pipe channel film.

20. A memory system comprising:
a 3D non-volatile memory device that includes a substrate including a first region and a second region, a pipe channel film that is formed on the substrate in the first region, a pipe gate that has a first concave region filled with the pipe channel film, and driving gate that is formed on the substrate in the second region and has at least one second concave region filled with at least one dummy pattern, wherein the first concave region and the second concave region are formed on a same layer; and
a memory controller that controls the 3D non-volatile memory device.

* * * * *